United States Patent [19]

Yamamoto et al.

[11] Patent Number: 5,672,983
[45] Date of Patent: Sep. 30, 1997

[54] LOW NOISE OUTPUT BUFFER CIRCUIT

[75] Inventors: Yoshinori Yamamoto, Chiba; Yukinori Tanaka, Tokyo, both of Japan

[73] Assignee: Kawasaki Steel Corporation, Hyogo, Japan

[21] Appl. No.: 604,703

[22] Filed: Feb. 21, 1996

[30] Foreign Application Priority Data

Feb. 21, 1995 [JP] Japan .................................... 7-032105

[51] Int. Cl.[6] ........................................... H03K 17/16
[52] U.S. Cl. ................................... 326/27; 326/86
[58] Field of Search ........................... 326/26–28, 83, 326/86, 87, 121; 327/380

[56] References Cited

U.S. PATENT DOCUMENTS

| | | | |
|---|---|---|---|
| 5,089,722 | 2/1992 | Amedeo | 326/27 X |
| 5,124,579 | 6/1992 | Naghshineh | 326/86 X |
| 5,140,194 | 8/1992 | Okitaka | 326/27 X |
| 5,194,764 | 3/1993 | Yano et al. | 326/86 |
| 5,231,311 | 7/1993 | Ferry et al. | 326/86 X |
| 5,315,172 | 5/1994 | Reddy | 326/27 |
| 5,517,129 | 5/1996 | Matsui | 326/28 X |

*Primary Examiner*—David R. Hudspeth
*Attorney, Agent, or Firm*—Oliff & Berridge

[57] ABSTRACT

An output buffer circuit is provided with at least two output MOS transistors of the same type. Each of the two output MOS transistors has a source terminal connected to a power supply or a ground and further has drain terminals connected to an output pad. Resistive elements connect the gate terminals of these output MOS transistors. An input terminal of an inverter is connected to an input signal line and an output terminal of the inverter is connected to the gate terminal of a first one of the at least two output MOS transistors. A charging MOS transistor of the same type as the at least two output MOS transistors has a drain terminal connected to the gate terminal of a second one of the at least two output MOS transistors. The charging MOS transistor has a source terminal connected to either the power supply or the ground and has a gate terminal connected to the input signal line.

15 Claims, 4 Drawing Sheets

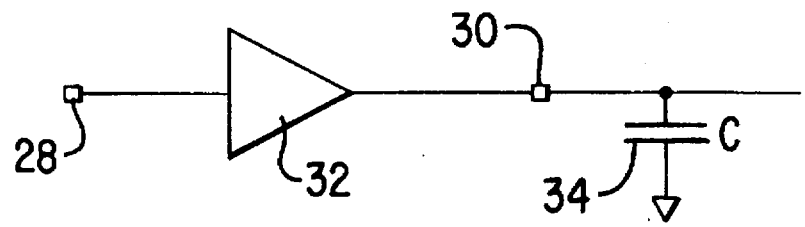
FIG. 5
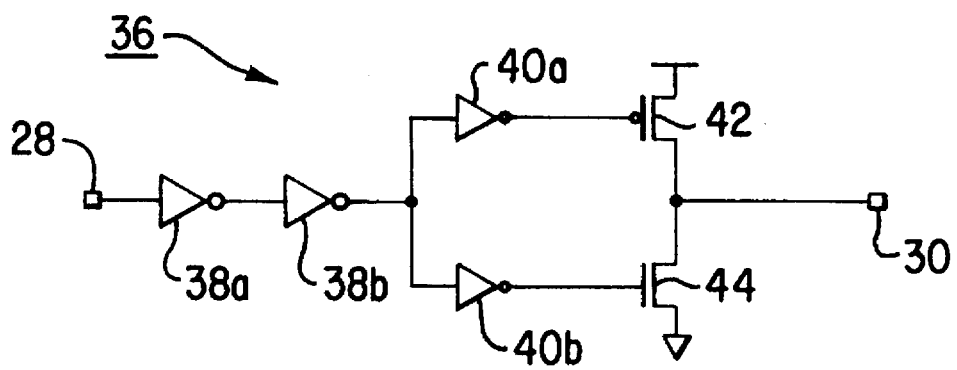
FIG. 6
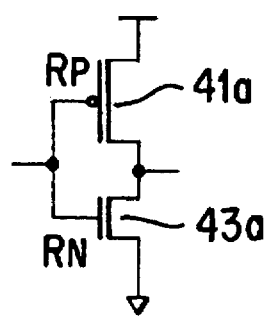 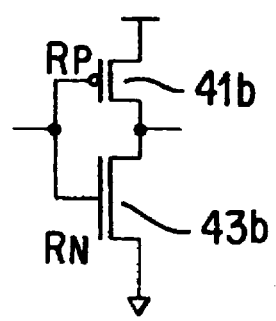
FIG. 7(a)  FIG. 7(b)

LOW NOISE OUTPUT BUFFER CIRCUIT

BACKGROUND OF THE INVENTION

1. Field of the Invention

The present invention generally relates to an output buffer circuit and, more particularly, to an output buffer circuit which can control the slew rate of an electric current to thereby prevent a noise from being caused.

2. Description of the Related Art

FIG. 5 is a schematic diagram for illustrating the configuration of an output buffer circuit for use in a semiconductor chip. As illustrated in FIG. 5, an internal signal line 28 is connected to the input terminal of an output buffer 32, the output terminal of which is connected with an output pad (namely, an output electrode) 30. Further, the output pad 30 is connected to a lead frame (not shown) through, for example, a bonding wire (not shown). Moreover, the semiconductor chip connected to this lead frame is sealed in a package. Furthermore, the semiconductor sealed in the package is used by being mounted on a printed circuit board.

An internal signal of the semiconductor chip is transferred to the exterior through this output buffer circuit 32. For instance, a signal having a high signal-level is outputted as an internal signal by charging a load capacitor 34, which is present in the outside of the semiconductor chip, and the parasitic capacitance of a bonding wire, a lead frame and interconnecting lines of the printed circuit board. Conversely, a signal having a low signal-level is outputted as another internal signal by discharging the capacitive component (C) that includes the load capacitor 34, which is present in the outside of the semiconductor chip, and the parasitic capacitance of bonding wires, a lead frame and interconnecting lines of the printed circuit board.

In this way, the capacitive component is charged and discharged iteratively each time when an internal signal is outputted. Regarding electric currents flowing at the time of charging and discharging the capacitive component, for example, when charging the capacitive component, an electric current is supplied from the power supply. In contrast, when discharging the capacitive component, an electric current is emitted to the ground. However, in such cases, noises (namely, what is called (dI/dt) noises), whose levels correspond to the quantity of a variation or change in the electric current required to charge and discharge the capacitive component, are caused in the power supply or the ground owing to the parasitic inductance components (L) such as the bonding wire, the lead frame and the interconnecting lines of the printed circuit board.

Especially, when the levels of signals outputted from a plurality of output buffer circuits are simultaneously changed into high levels (or low levels), a large current flows therefrom. Thus, large or high-level noises are brought about, so that the electric potential at the power supply or at the ground varies. The conventional output buffer circuit, therefore, has drawbacks (or problems) in that such a variation in the electric potential at the power supply or at the ground affects the internal logic of the semiconductor chip and causes a malfunction. It is necessary for preventing a noise from being caused by the inductance component to reduce the inductance component by, for instance, altering the materials of the lead frame, or to constrain an abrupt change in the electric current.

Next, a practical example of the conventional output buffer circuit will be described hereinbelow. Moreover, the drawbacks of this example will be also described. Referring now to FIG. 6, there is shown a circuit diagram which illustrates the configuration of the example of the conventional output buffer circuit. This output buffer circuit 36 comprises: inverters 38a and 38b connected in series; inverters 40a and 40b connected in parallel; and inverters of the last (or final) output stage, namely, a P-type MOS transistor (namely, a P-channel MOS transistor (hereunder referred to simply as a PMOS)) 42 and an N-type MOS transistor (namely, an N-channel MOS transistor (hereunder referred to simply as an NMOS)) 44.

As shown in this figure, an internal signal line 28 is connected to the input terminal of the inverter 38a. Further, the output terminal of this inverter 38a is connected to the input terminal of the inverter 38b. Moreover, the output terminal of this inverter 38b is connected to the input terminals of the inverters 40a and 40b. Furthermore, the output terminals of the inverters 40a and 40b are connected to the gate terminals of the PMOS 42 and the NMOS 44, respectively. Additionally, the source terminals of the PMOS 42 and the NMOS 44 are connected to the power supply and the ground, respectively. Besides, the drain terminals of the PMOS 42 and the NMOS 44 are short-circuited and are further connected to the output pad 30.

This output buffer circuit 36 is formed in such a manner that the off-operations of turning off the PMOS 42 and the NMOS 44 are performed at high speeds and moreover, only the on-operations of turning on the PMOS 42 and the NMOS 44 are performed slowly, by regulating the input threshold voltages of the inverters 40a and 40b, which are connected in parallel, in the following manner. For example, the size (or dimension) of the PMOS 41a of the inverter 40a of FIG. 7A is increased, while that of the NMOS 43a thereof is decreased. Namely, the on-resistance (namely, the on-state resistance) $R_P$ of the PMOS 41a is reduced, whereas the on-resistance $R_N$ of the NMOS 43a is increased. Further, the size of the PMOS 41b of the inverter 40b of FIG. 7B is decreased, while that of the NMOS 43b thereof is increased. Namely, the on-resistance $R_P$ of the PMOS 41b is increased, whereas the on-resistance $R_N$ of the NMOS 43b is decreased.

In the case of this output buffer circuit 36, an abrupt change in the electric current is restrained by slowly performing the operations of turning on the PMOS 42 and the NMOS 44 of the inverter of the last output stage. Thus, a noise is prevented from being caused.

Further, FIG. 8 is a circuit diagram for illustrating the configuration of another example of the conventional output buffer circuit. This output buffer circuit 46 comprises: inverters 48a and 48b connected in series; inverters 50a, 50b, 50c and 50d connected in parallel; and PMOSs 52a and 52b and NMOSs 54a and 54b which are inverters of the last output stage divided into two parts.

As shown in this figure, an internal signal line 28 is connected to the input terminal of the inverter 48a. Further, the output terminal of this inverter 48a is connected to the input terminals of the inverter 48b. Moreover, the output terminal of this inverter 48b is connected to the input terminals of the inverters 50a, 50b, 50c and 50d. Furthermore, the output terminals of the inverters 50a, 50b, 50c and 50d are connected to the gate terminals of the PMOSs 52b and 52a and the NMOSs 54a and 54b, respectively. Additionally, the source terminals of the PMOSs 52a and 52b and the NMOSs 54a and 54b are connected to the power supply and the ground, respectively. Besides, the drain terminals of the PMOSs 52a and 52b and the NMOSs 54a and 54b are short-circuited and are further connected to the output pad 30.

This output buffer circuit 46 is configured in such a way that the switching operations of the PMOS 52b and the NMOS 54b are slower than those of the PMOS 52a and the NMOS 54a, by regulating the input threshold voltages of the inverters 50a, 50b, 50c and 50d, which are connected in parallel, namely, for example, by setting the size of the inverters 50a and 50d as being smaller than that of the inverters 50b and 50c.

Thus, in the case of this output buffer circuit 46, a time of turn-on of each of the PMOSs 52a and 52b and the NMOSs 54a and 54b is shifted from that of turn-on of another thereof, and these MOSs 52a, 52b, 54a and 54b are turned on serially by dividing the inverter of the last output stage into a plurality of parts such as the PMOSs 52a and 52b and the NMOSs 54a and 54b, and by regulating the speed in (or at) performing an switching operation among the inverters 50a, 50b, 50c and 50d provided respectively corresponding to the PMOS 52a and 52b and the NMOSs 54a and 54b. Thereby, an abrupt change in the electric current is constrained. Consequently, a noise is restrained from being made.

Incidentally, similarly as in the case of the output buffer circuit 36 of FIG. 6, operations of turning off the PMOSs 52a and 52b and the NMOSs 54a and 54b can be performed at high speed and only operations of turning on these MOSs are performed slowly by increasing the sizes of the PMOSs of the inverters 50a and 50b and simultaneously reducing those of the NMOSs of these inverters and moreover, by reducing the sizes of the PMOSs of the inverters 50c and 50d and simultaneously increasing those of the NMOSs of these inverters.

Any of the aforementioned conventional output buffer circuits are formed in such a manner that the adjustment of the time of turn-on and turn-off of the inverter of the last output stage is performed by individually regulating the switching characteristics of the inverter provided in the pre-stage of the last output stage. Such techniques have been developed mainly in conventional semiconductor devices which use 5-volt power supply systems.

Current semiconductor devices, however, have a tendency to use 3-volt power supply systems. Thus, the conventional method of regulating the switching characteristics of the inverters provided separately from one another has a drawback in that it becomes difficult to cope with the drop of the power supply voltage to a low voltage. Actually, there is the necessity of a margin for ensuring the operations. Thus, this conventional method has other drawbacks in that when the power supply voltage becomes low, the range, in which the switching characteristics of the individual inverter are regulated, becomes very narrow, and that it becomes very difficult to design the layout of an output buffer circuit. Therefore, in the case that a 3-volt power supply system is used in the conventional output buffer circuit, the delicate regulation among the inverters became very difficult. Consequently, this conventional method has further drawbacks in that an abrupt change in the electric current cannot be constrained and that satisfactory results on a reduction in noises cannot be obtained.

SUMMARY OF THE INVENTION

In view of the drawbacks of the prior art, an object of the present invention is to provide an output buffer circuit which can easily constrain an abrupt change in electric current and can prevent a noise from being caused, and the design of a layout of which can be easily achieved.

To achieve the foregoing object, in accordance with an aspect of the present invention, there is provided an output buffer circuit that comprises: at least two MOS transistors of the same type, which has a source terminal connected to a power supply or a ground and further has a drain terminal short-circuited and connected to an output pad; resistive elements disposed between the gate terminals of these MOS transistors; an inverter, which has an input terminal connected to an internal signal line and has an output terminal connected to the gate terminal of one of said at least two NMOS transistors of the same type, to which one terminal of corresponding one of these resistive elements is connected; and the MOS transistors of the same type having a drain terminal connected to the gate terminal of the MOS transistor of the same type which is not connected to the output terminal of the inverter, and further having a source terminal connected to the power supply or the ground and furthermore having a gate terminal connected to the internal signal line.

Further, the resistive element is an N-type MOS transistor having a gate terminal connected to the power supply, or a P-type MOS transistor having a gate terminal connected to the ground.

Here, an open-source type output buffer circuit can be configured by using the P-type MOS transistors as the MOS transistors of the same type. Further, an open-drain type output buffer circuit can be configured by using the N-type MOS transistors as the MOS transistors of the same type. Moreover, a CMOS type output buffer circuit can be configured by combining the open-source output buffer circuit with the open-drain output buffer circuit. Furthermore, a 3-state output buffer circuit can be configured by adding a signal line, which is used for switching between the enabling/disabling of an output operation, besides a signal transmission line as the internal signal line.

The output buffer circuit of the present invention is configured in such a manner that the MOS transistors composing the inverters of the last output stage are divided into two or more sets and that the resistive elements are disposed between the gate terminals of these sets and are connected in series and a terminal of each of these resistive elements is driven by an inverter for inverting an internal signal.

In the case of the CMOS-type output buffer circuit of the present invention, regardless of the number of sets into which each of the PMOSs and the NMOSs composing the inverters of the last output buffer are divided, electric charges with which the gate terminals of these PMOS are charged up, are discharged and similarly, the gate terminals of these NMOSs are charged up with electric charges by one inverter. Thus, on-operations of turning on the inverters of the last output stage are performed slowly. Further, an RC-transmission path (namely, an RC tree) is composed of: resistive elements (R) for connecting the gate terminals of the PMOSs and the NMOSs composing the inverters of the last output stage in series; and capacitive components (C) such as gate capacitance and what is called "wiring capacitance" (namely, distributed capacitance dispersed through a wire). Thus, internal signals inverted by the inverter are automatically delayed each time when passing through the resistive elements connected in series and are then inputted to the gate terminals of the PMOSs and the NMOSs. Consequently, the time of turn-on of each of the PMOSs and the NMOSs is inevitably shifted from that of turn-on of the other thereof, so that the PMOSs and the NMOSs are sequentially put into an on-state. Moreover, the PMOSs and the NMOSs composing the inverters of the last output stage can be put into an off-state instantaneously and simultaneously by providing PMOSs and NMOSs, which are used for charging up and discharging, at the gates of PMOSs and NMOSs, which are not driven directly by the inverter for inverting internal signals, among the PMOSs and the NMOSs composing the inverters of the last output stage.

Therefore, in accordance with the CMOS type buffer circuit of the present invention, needless to say, an abrupt change in the electric current can easily be constrained. Further, a noise can be prevented from being caused. Moreover, the design of a layout of the CMOS buffer circuit can easily be achieved, irrespective of which of the 5-volt power supply system and the 3-volt power supply system is used.

These advantages can be attained irrespective of whether the output buffer circuit of the present invention is of the open-drain type or of the 3-state output buffer type.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIG. 5 is a schematic diagram for illustrating the configuration of an output buffer circuit of a semiconductor chip;

FIG. 6 is a circuit diagram for illustrating the configuration of an example of the conventional output buffer circuit;

FIGS. 7A and 7B are circuit diagrams each for illustrating an example of an inverter.

DETAILED DESCRIPTION OF THE PREFERRED EMBODIMENTS

Hereinafter, output buffer circuits embodying the present invention, namely, the preferred embodiments of the present invention will be described in detail by referring to the accompanying drawings.

Figure 1:
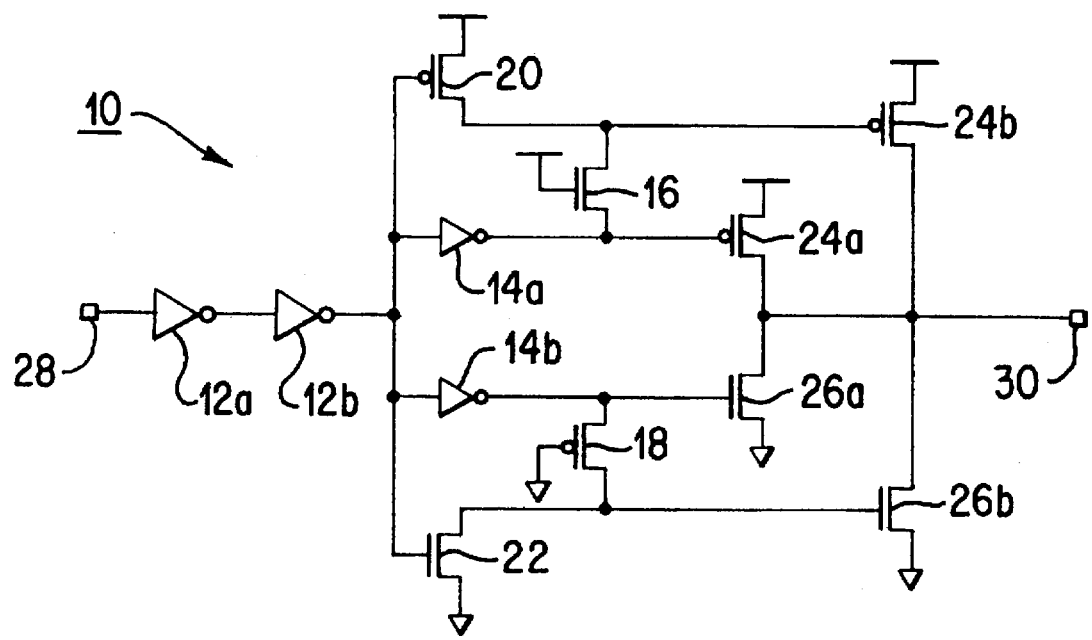
FIG. 1 is a circuit diagram for illustrating the configuration of a first output buffer circuit embodying the present invention, namely, a first embodiment of the present invention.

FIG. 1 is a circuit diagram for illustrating the configuration of the first output buffer circuit embodying the present invention, namely, the first embodiment of the present invention. This output buffer circuit 10 is provided with inverters 12a and 12b connected in series; inverters 14a and 14b connected in parallel; an NMOS 16 and a PMOS 18 which are normally-turned-on transistors to be used as the resistive elements; a PMOS 20 and an NMOS 22 which are used for charging up and discharging; and PMOSs 24a and 24b and NMOSs 26a and 26b which are inverters of the last output stage.

As shown in this figure, the internal signal line 28 is connected to the input terminal of the inverter 12a. Further, the output terminal of this inverter 12a is connected to the input terminal of the inverter 12b. The output terminal of this inverter 12b is connected to the input terminals of the inverters 14a and 14b and to the gate terminals of the PMOS 20 and the NMOS 22. Moreover, the output terminal of the inverter 14a is connected to the gate terminal of PMOS 24a and to the source terminal of the NMOS 16. Similarly, the output terminal of the inverter 14b is connected to the gate terminal of the NMOS 26a and to the source terminal of the PMOS 18. Furthermore, the gate terminals of the NMOS 16 and the PMOS 18 are connected to the power supply and the ground, respectively.

Additionally, the source terminals of the PMOS 20 and the NMOS 22 are connected to the power supply and the ground, respectively. The drain terminals of the PMOS 20 and the NMOS 22 are connected with those of the NMOS 16 and the PMOS 18, respectively, and are further connected to the gate terminals of the PMOS 24b and the NMOS 26b, respectively. Besides, the source terminals of the PMOSs 24a and 24b and those of the NMOSs 26a and 26b are connected to the power supply and the ground, respectively. The drain terminals of the PMOSs 24a and 24b and the NMOSs 26a and 26b are short-circuited and are further connected to an output pad 30.

Next, an operation of this output buffer circuit 10 will be described hereunder.

First, when an internal signal has a low level, the output terminals of the inverters 12a and 12b are at a high level and at the low level, respectively. At that time, the output terminal of the inverter 14a, namely, the gate terminal of the PMOS 24a is at the high level. Thus, the PMOS 24a is in an off-state. Further, the PMOS 20 is in an on-state, so that the gate terminal of the PMOS 24b is charged up by the PMOS 20 and is thus at the high level. Consequently, the PMOS 24b is also in the off-state.

On the other hand, the output terminal of the inverter 14b, thus, the gate terminal of the NMOS 26a is at the high level. Therefore, the NMOS 26a is in the on-state. Further, the NOMS 22 is in the off-state, so that the gate terminal of the NMOS 26b is not discharged by the NMOS 22 but is pre-charged by the inverter 14b through the normally-turned-on PMOS 18 and thus is at the high level. Consequently, the NMOS 26b is also in the on-state. Namely, all of the gate terminals of the PMOSs 24a and 24b and the NMOS 26a and 26b are at the high level. Therefore, an output signal outputted from the drain terminals thereof, namely, an output signal outputted from the output pad 30 has the low level.

When this state of the internal signal is changed into another state in which the signal level thereof is the high level, the signal levels at the output terminals of the inverters 12a and 12b are changed into the low level and the high level, respectively. At that time, a signal level at the output terminal of the inverter 14a is changed into the low level. Thus, the gate terminal of the PMOS 24a is discharged by the inverter 14a and the signal level thereat is thus changed into the low level. As a result, the PMOS 24a is put into the on-state. In contrast, the PMOS 20 is put into the off-state. Further, the charging-up of the gate terminal of the PMOS 24b by the PMOS 20 is stopped. Thus, the gate terminal of the PMOS 24b is gradually discharged by the inverter 14a through the normally-turned-on NMOS 16. Consequently, the signal level thereat becomes the low level, and the PMOS 24b is also put into the on-state.

As described above, the electric charges, with which the gate terminals of the PMOSs 24a and 24b are charged up, are discharged or removed by the single inverter 14a. At that time, the electric charge stored at the gate terminal of the PMOS 24b flows into the gate terminal of the PMOS 24a through the normally-turned-on NMOS 16, so that the electric charge, with which the gate terminals of the PMOSs 24a and 24b have been charged up, are discharged or removed gradually throughout the discharging.

Further, the normally-turned-on NMOS 16 becomes the resistive component (R). Moreover, there are capacitive components (C) such as the gate capacitance of the PMOS 24b and the wiring capacitance. Thus, an RC transmission path is composed of these resistive and capacitive components. Furthermore, the discharging of the gate terminal of the PMOS 24b is performed by inevitably lagging behind that of the gate terminal of the PMOS 24a. Therefore, the operations of turning on the PMOSs 24a and 24b can be performed slowly. Moreover, the time of turn-on of the PMOS 24b can be necessarily shifted from that of turn-on of the PMOS 24a. Consequently, an abrupt change in the electric current is constrained, so that a noise can be prevented from being caused.

On the other hand, the signal level at the output terminal of the inverter 14b becomes the low level. Thus, the gate terminal of the NMOS 26a is discharged by the inverter 14b and thus becomes at the low signal level. Consequently, the NMOS 26a becomes in the off-state. In contrast, the NMOS 22 becomes in the on-state. Thereby, the gate terminal of the NMOS 26b is quickly discharged by the NMOS 22 and thus becomes at the low signal level. As a result, the NMOS 26b also becomes in the off-state. Namely, all of the gate terminals of the PMOSs 24a and 24b and the NMOSs 26a and 26b become at the low signal level. The level of an output signal outputted from the drain terminal thereof, namely, from the output pad 30 becomes the high level.

Next, when this state of the internal signal is changed into another state in which the signal level thereof is the low level, the signal levels at the output terminals of the inverters 12a and 12b are changed into the high level and the low level, respectively. At that time, a signal level at the output terminal of the inverter 14a is changed into the high level. Thus, the gate terminal of the PMOS 24a is charged up by the inverter 14a and is thus changed into the high level. As a result, the PMOS 24a is put into the off-state. In contrast, the PMOS 20 is put into the on-state. Thus, the gate terminal of the PMOS 24b is charged up by the PMOS 20. Consequently, the signal level thereat is quickly changed into the high level, and the PMOS 24b is also put into the off-state.

On the other hand, the signal level at the output terminal of the inverter 14b becomes the high level. Thus, the gate terminal of the NMOS 26a is charged up by the inverter 14b and thus becomes at the high signal level. Consequently, the NMOS 26a becomes in the on-state. In contrast, the NMOS 22 becomes in the off-state. Thereby, the discharging of the gate terminal of the NMOS 26b by the NMOS 22 is ceased. Further, the gate terminal of the NMOS 26b is gradually charged up by the inverter 14b through the normally-turned-on PMOS 18 and thus becomes at the high signal level. As a result, the NMOS 26b also becomes in the on-state. Namely, all of the gate terminals of the PMOSs 24a and 24b and the NMOSs 26a and 26b become at the high signal level. The level of an output signal outputted from the drain terminal thereof, namely, from the output pad 30 becomes the low level.

As described above, both of the gate terminals of the NMOSs 26a and 26b are charged up by the single inverter 14b. At that time, the electric charge, with which the gate terminal of the NMOS 26a is charged up, flows into the gate terminal of the NMOS 26b through the normally-turned-on PMOS 18, so that the gate terminals of the NMOSs 26a and 26b are charged up gradually throughout the charging.

Further, the normally-turned-on PMOS 18 becomes the resistive component (R). Moreover, there are capacitive components (C) such as the gate capacitance of the NMOS 26b and the wiring capacitance. Thus, an RC transmission path is composed of these resistive and capacitive components. Furthermore, the discharging of the gate terminal of the NMOS 26b is performed by inevitably lagging behind that of the gate terminal of the NMOS 26a. Therefore, the operations of turning on the NMOSs 26a and 26b can be performed slowly. Moreover, the time of turn-on of the NMOS 26b can be necessarily shifted from that of turn-on of the NMOS 26a. Consequently, an abrupt change in the electric current is constrained, so that a noise can be prevented from being made.

As is seen from the foregoing description, in the case of this output buffer circuit 10, there is no necessity of separately controlling the PMOSs 24a and 24b and the NMOS 26a and 26b, which are a plurality of components obtained by dividing the inverters of the last output stage. Thus, a characteristic aspect of this output buffer circuit resides in that the layout thereof can easily be designed. Incidentally, the time lag between the moment at which the PMOSs 24a and 24b (or the NMOSs 26a and 26b) can suitably be regulated by changing the transistor size of each of the NMOS 16 and the PMOS 18 to thereby appropriately select the resistance thereof, alternatively, by changing the transistor size of each of the inverters 14a and 14b to thereby appropriately select the driving performance thereof.

In the case of this output buffer circuit, the normally-turned-on PMOS transistor 18 and the normally-turned-on NMOS transistor 16 are used as the resistive elements. The present invention is not limited thereto. Any other component, which acts as a resistive element, may be employed instead of the transistors 16 and 18. For example, a diffusion resistance or a poly-silicon resistance, which is doped with an impurity, may be used as the resistive element.

Additionally, the circuit configuration of this output buffer circuit 10 of the present invention is not limited to that of FIG. 1 and can suitably be modified if necessary. For instance, each of the transistors of the last output stage, which are composed of the PMOSs 24a and 24b and the NMOSs 26a and 26b, has only to be divided into at least two sets. Further, the number of division of PMOSs (incidentally, the PMOSs 24a and 24b in this case) is not necessarily equal to that of division of NMOSs (incidentally, the NMOSs 26a and 26b in this case).

Figure 2:
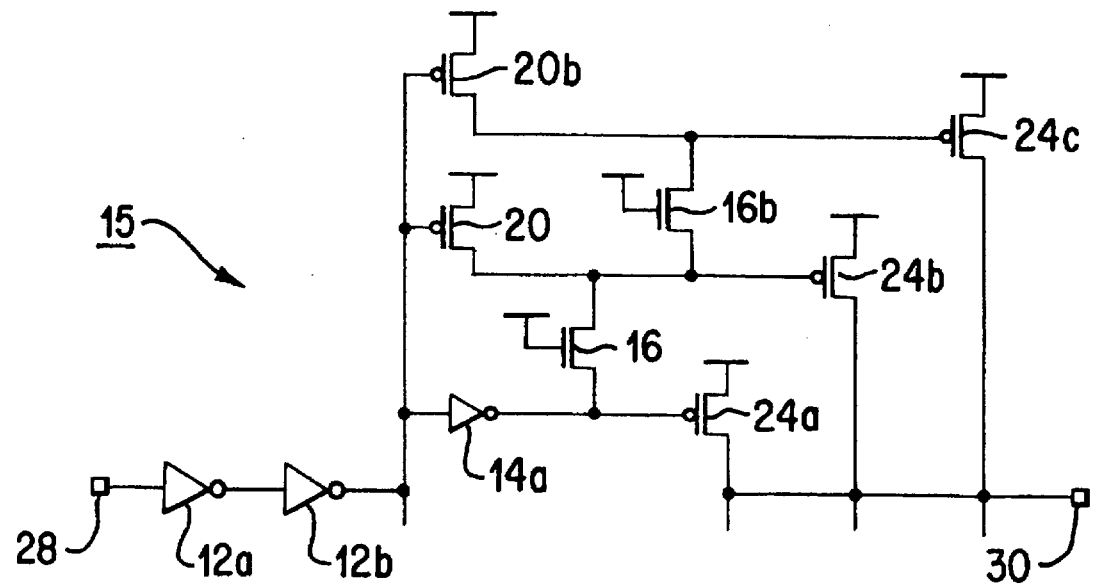
FIG. 2 is a partially enlarged diagram for illustrating the configuration of a second output buffer circuit embodying the present invention, namely, a second embodiment of the present invention.

Referring to, for example, FIG. 2, there is shown a partially enlarged diagram for illustrating the configuration of the second output buffer circuit of the present invention, namely, the second embodiment of the present invention. In the case of this output buffer circuit 15, PMOSs composing the inverters of the last output stage are divided into three sets. Incidentally, this output buffer circuit 15 is different from the output buffer circuit 10 of FIG. 1 only in that the PMOSs composing the inverters of the last output stage are divided into three sets and that thus, a normally-turned-on transistor, which is used as a resistive element, and a transistor for charging up are further added to the composing elements of the latter output buffer circuit. Therefore, like reference characters designate like composing elements.

Further, the detailed description of such composing elements are omitted herein for simplicity of description.

Namely, this output buffer circuit 15 has the composing elements of the output buffer circuit 10 of FIG. 1 and further has: a PMOS 24c which constitutes the inverter of the last output stage; an NMOS 16b which is a normally-turned-on transistor to be used as the resistive component; and a PMOS 20b to be used for charging up.

Further, the source terminal of the PMOS 24c is connected to the power supply. Moreover, the drain terminal of the PMOS 24c is connected to the drain terminals of the PMOSs 24a and 24b and the NMOSs 26a and 26b and is further connected to the output pad. The source terminal and the drain terminal of the NMOS 16b are connected to the gate terminals of the PMOSs 24b and 24c, respectively. Furthermore, the gate terminal of the NMOS 16b is connected to the power supply. Additionally, the source terminal of the PMOS 20b is also connected to the power supply. Further, the drain terminal of the PMOS 20b is connected to the gate terminal of the PMOS 24c. Moreover, the gate terminal of the PMOS 20b is connected to the output terminal of the inverter 12b.

In the case that PMOSs composing the inverters of the last output stage are divided into three or more sets similarly as in this output buffer circuit 15, a single NMOS, which is a normally-turned-on transistor to be used as the resistive element, and a single PMOS for charging up are added to the circuit each time when the number of PMOSs composing the inverters of the last output stage is increased or incremented by one.

Further, the NMOS, which is a normally-turned-on transistor to be used as the resistive component or element, has the gate terminal connected to the power supply, and further has the source terminal and the drain terminal respectively connected to the gate terminals of the PMOSs which compose the inverters of the last output stage. Moreover, the PMOS, which is a transistor for charging up, has the source terminal connected to the power supply, the gate terminal connected to the output terminal of the inverter 12b, and the drain terminal connected to the gate terminal of the PMOS composing the inverter of the last output stage.

Incidentally, the PMOSS composing the inverters of the last output stage have been described hereinabove by way of example. Needless to say, the NMOSs composing the inverters of the last output stage can be similarly configured except that the normally-turned-on transistor to be used as the resistive element is changed into a PMOS and that the transistor for charging up is further changed into an NMOS.

Next, the NMOS 16 and the PMOS 18 have only to be resistive elements. Generally, a poly-silicon resistance, a diffusion layer resistance and a sheet resistance may be used instead of to the NMOS 16 and the PMOS 18. In view of the easiness of regulation of the resistance and the layout area, it is most favorable that the NMOS 16 and the PMOS 18 are used as illustrated in this figure. Incidentally, a synthetic resistance is formed from the resistive elements connected in series. Thus, the resistance of the resistive elements may be changed by, for instance, gradually decreasing the resistance thereof.

Further, the PMOS 20 for charging up and the NMOS 22 for discharging are used to perform the operations of turning off the PMOSs 24a and 24b and the NMOSs 26a and 26b at high speed. Although there is no problem even if the PMOS 20 and the NMOS 22 are omitted, it is preferable that the PMOS 20 and the NMOS 22 are appropriately provided in the output buffer circuit as needed. Moreover, the inverters 12a and 12b connected in series act as buffers for driving internal signals toward the gate terminals of the inverters 14a and 14b and the PMOS 20 and the NMOS 22. The configuration of the output buffer circuit of the present invention is not limited to such a configuration of the circuit. Additionally, needless to say, the inverters 14a and 14b connected in parallel may be replaced with a single inverter.

Figure 3:
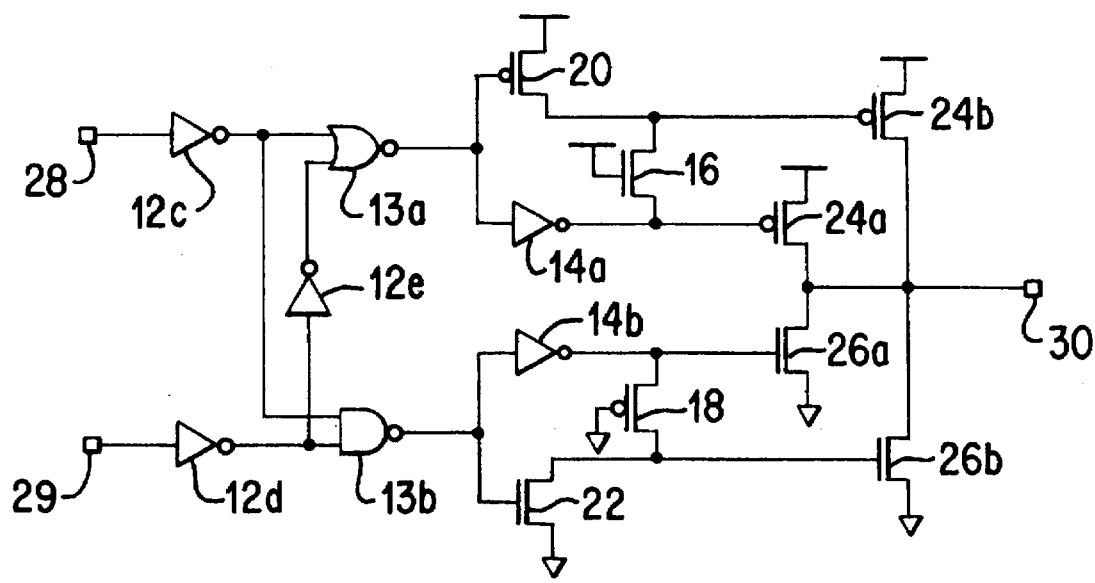
FIG. 3 is a circuit diagram for illustrating the configuration of a third output buffer circuit embodying the present invention, namely, a third embodiment of the present invention.

Next, the third embodiment of the present invention (namely, a case that the present invention is applied to a 3-state output buffer) will be described hereinbelow. FIG. 3 is a circuit diagram for illustrating the case of applying the present invention to a 3-state output buffer circuit. In this figure, like reference characters designate like composing elements of FIG. 1. In FIG. 3, reference numeral denotes an internal signal line. Further, an enabling/disabling switch terminal 29 is a signal terminal for switching between the enabling/disabling of an output operation. First, when the switch terminal 29 is in an L-state, a signal having been put in an H-state is inputted to one of the input terminals of a NAND circuit 13b through an inverter 12d. Further, a signal having been put in an L-state is inputted to one of the input terminals of a NOR circuit 13a through an inverter 12e. Thus, an inversion signal of the internal signal passing through an inverter 12c is further inverted by the NAND circuit 13b and the NOR circuit 13a. However, outputs of these circuits have a same sign. Therefore, an operation to be thereafter performed by the output buffer circuit is basically the same as that of the output buffer circuit of the first embodiment.

Next, when the switch terminal 29 is in the H-state, a signal having been put in the L-state is inputted to one of the input terminals of the NAND circuit 13b. Further, a signal having been put in the H-state is inputted to one of the input terminals of the NOR circuit 13a. Thus, an output of the NAND circuit 13b becomes in the H-state regardless of the state of the internal signal line. Moreover, an output of the NOR circuit 13a becomes in the L-state, irrespective of the state of the internal signal line. As a result, all of the output PMOS transistors 24a and 24b and the output NMOS transistors 26a and 26b are turned off. Thus, the output terminal 30 is put into a high-impedance state. Incidentally, needless to say, a bi-directional input/output circuit can easily be configured by connecting the 3-state output buffer circuit, which has been described hereinabove, to an input circuit.

Figure 4:
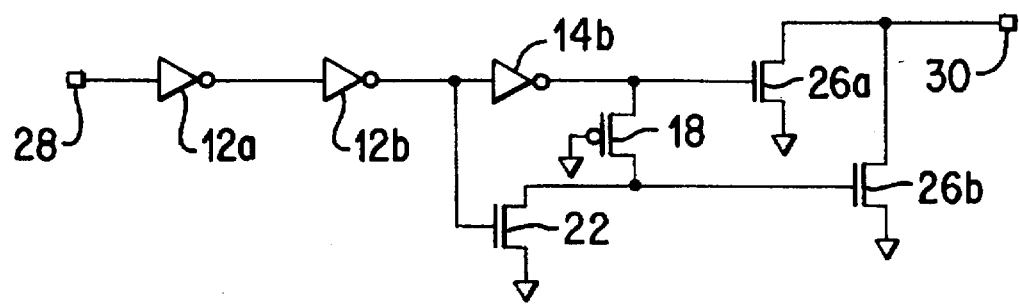
FIG. 4 is a circuit diagram for illustrating the configuration of a fourth output buffer circuit embodying the present invention, namely, a fourth embodiment of the present invention.
Figure 8:
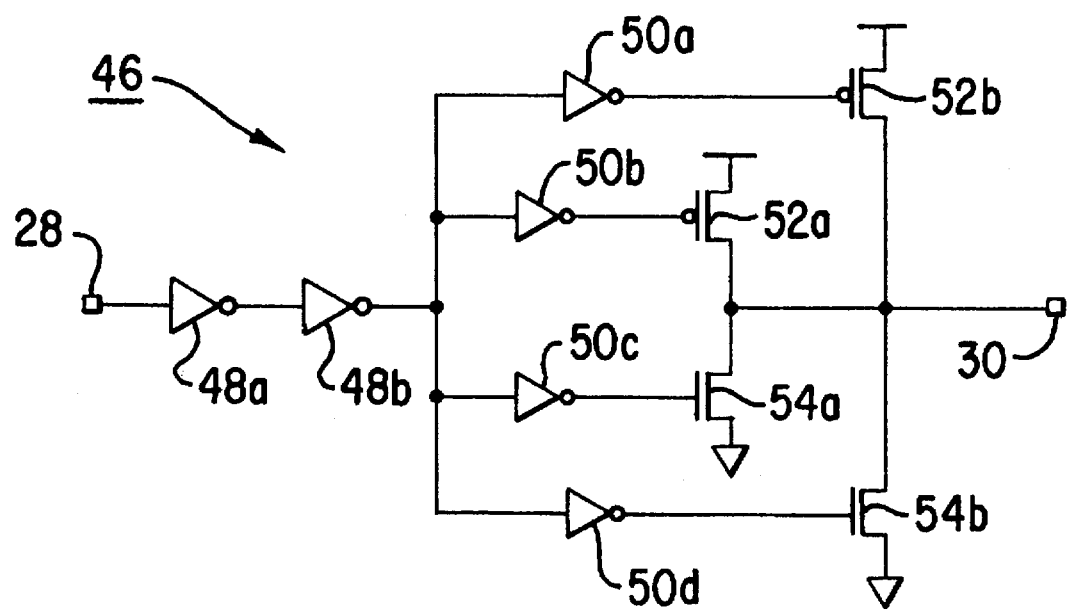
FIG. 8 is a circuit diagram for illustrating the configuration of another example of the conventional output buffer circuit.

Next, the fourth embodiment of the present invention, namely, the case of applying the present invention to an open-drain type output buffer circuit will be described hereunder as illustrated in FIG. 4. Further, like reference characters designate like composing elements of FIG. 1. Moreover, an operation of the fourth embodiment is similar to that of the first embodiment. Thus, the description of the operation of the fourth embodiment is omitted herein for brevity of description. Furthermore, an open-source (type) output buffer circuit can be constituted by using a PMOS transistor as an output transistor, based on similar ideas.

As above described in detail, the output buffer circuit of the present invention is configured by dividing PMOSs and/or NMOSs, which compose the inverters of the last output stage, into a plurality of sets, and connecting the gate terminals of the PMOSs, which are obtained by the division, in series through a resistive element disposed between the gate terminals of these PMOSs, and similarly connecting the gate terminals of the NMOSs, which are obtained by the division, in series through a resistive element disposed between the gate terminals of these NMOSs, and further inverting internal signals by means of the inverters and then driving the terminal of the resistive elements connected in series.

In the case of the output buffer circuit of the present invention, the PMOSs and/or the NMOSs, which are divided into a plurality of sets and compose the inverters of the output stage, are driven by an inverter for inverting internal signals. Thus, the operation of turning on the PMOSs and the NMOSs can be performed slowly throughout the operation. Further, the resistive components or elements connected in series compose the RC transmission path, together with the capacitive components such as the gate capacitance Of the PMOSs and the NMOSs and the wiring capacitance. Thus, internal signals inverted by the inverter are automatically delayed each time when passing through the resistive elements connected in series. Consequently, the time of turn-on of each of the PMOSs and the NMOSs is inevitably shifted from that of turn-on of the other thereof, so that the PMOSs and the NMOSs can sequentially be put into an on-state.

Therefore, in accordance with the output buffer circuit of the present invention, needless to say, an abrupt change in the electric current is constrained. Moreover, noises can be prevented from being caused. Furthermore, there is no necessity of individually controlling the-PMOSs and/or the NMOSs, which compose the inverters of the last output stage divided into a plurality of sets. Thus, a characteristic aspect of the output buffer circuit of the present invention resides in that the layout of the output buffer circuit can easily achieved.

Although the preferred embodiments of the present invention have been described above, it should be understood that the present invention is not limited thereto and that other modifications will be apparent to those skilled in the art without departing from the spirit of the invention.

The scope of the present invention, therefore, should be determined solely by the appended claims.

What is claimed is:

1. An output buffer circuit, comprising:
   at least two output P-type MOS transistors, a source terminal of a first P-type MOS transistor of the at least two P-type output MOS transistors and a source terminal of a second P-type MOS transistor of the at least two output P-type MOS transistors being connected to a power supply and drain terminals of the first and second P-type MOS transistors being connected to an output pad;
   at least one resistive element, a first terminal of one of the at least one resistive element being connected to a first gate terminal of the first p-type MOS transistor and a second terminal of the one of the at least one resistive element being connected to a second gate terminal of the second P-type MOS transistor;
   an inverter having an input terminal and an output terminal, the input terminal being connected to an input signal line and the output terminal being connected to the first gate terminal of the first P-type MOS transistor; and
   at least one charging P-type MOS transistor, the at least one charging transistor being a third P-type MOS transistor having a drain terminal connected to the second gate terminal of the second P-type MOS transistor, a source terminal of the third P-type MOS transistor being connected to the power supply, a gate terminal of the third P-type MOS transistor being connected to the input signal line.

2. The output buffer circuit according to claim 1, wherein the at least one resistive element is an N-type MOS transistor, a gate terminal of the N-type MOS transistor is connected to the power supply.

3. The output buffer circuit according to claim 1, wherein the at least one resistive element is one of a diffusion resistor and a poly-silicon resistor, each of the at least one resistive element being doped with an impurity.

4. An output buffer circuit, comprising:
   at least two output P-type MOS transistors, a source terminal of a first P-type MOS transistor of the at least two output P-type MOS transistors and a source terminal of a second P-type MOS transistor of the at least two output P-type MOS transistors being connected to a power supply and drain terminals of the first and second P-type MOS transistors being connected to an output pad;
   a first at least one resistive element, a first terminal of the first at least one resistive element being connected to a first gate terminal of the first P-type MOS transistor and a second terminal of the first at least one resistive element being connected to a second gate terminal of the second P-type MOS transistor;
   a first inverter having a first input terminal and a first output terminal, the first input terminal being connected to an input signal line and the first output terminal being connected to the first gate terminal of the first P-type MOS transistor;
   at least one charging P-type MOS transistor, the at least one charging transistor being a third P-type MOS transistor having a drain terminal connected to the second gate terminal of the second P-type MOS transistor, a source terminal of the third P-type MOS transistor being connected to the power supply and a gate terminal of the third P-type MOS transistor being connected to the input signal line;
   at least two output N-type MOS transistors, a source terminal of a first N-type MOS transistor of the at least two output N-type MOS transistors and a source terminal of a second N-type MOS transistor of the at least two output N-type MOS transistors being connected to the ground and drain terminals of the first and second N-type MOS transistors being connected to the output pad;
   a second at least one resistive element, a first terminal of the second at least one resistive element being connected to a first gate terminal of the first N-type MOS transistor and a second terminal of the second at least one resistive element being connected to a second gate terminal of the second N-type MOS transistor;
   a second inverter having a second input terminal and a second output terminal, the second input terminal being connected to the input signal line and the second output terminal being connected to the first gate terminal of the first N-type MOS transistor; and
   at least one charging N-type MOS transistor, the at least one charging transistor being a third N-type MOS transistor having a drain terminal connected to the second gate terminal of the second N-type MOS transistor, a source terminal of the third N-type MOS transistor being connected to the ground and a gate terminal of the third N-type MOS transistor being connected to the input signal line.

5. The output buffer circuit according to claim 4, further comprising:
   at least one inverter connected to the first and second input terminals of the first and second inverters.

6. The output buffer circuit according to claim 4, wherein the first at least one resistive element is an N-type MOS transistor, a gate terminal of the N-type MOS transistor being connected to the power supply, the second at least one resistive element being a P-type MOS transistor, a gate terminal of the P-type MOS transistor being connected to the ground.

7. The output buffer circuit according to claim 5, wherein the first at least one resistive element is an N-type MOS transistor, a gate terminal of the N-type MOS transistor being connected to the power supply, the second at least one resistive element being a P-type MOS transistor, a gate terminal of the P-type MOS transistor being connected to the ground.

8. The output buffer circuit according to claim 4, wherein the first and second at least one resistive elements are one of diffusion resistors and poly-silicon resistors, each of the first and second at least one resistive elements being doped with an impurity.

9. The output buffer circuit according to claim 5, wherein the first and second at least one resistive elements are one of diffusion resistors and poly-silicon resistors, each of the first and second at least one resistive elements being doped with an impurity.

10. A 3-state output buffer circuit, comprising:

at least two output P-type MOS transistors, a source terminal of a first P-type MOS transistor of the at least two output P-type MOS transistors and a source terminal of a second P-type MOS transistor of the at least two output P-type MOS transistors being connected to a power supply and drain terminals of the first and second P-type MOS transistors being connected to an output pad;

a first at least one resistive element, a first terminal of the first at least one resistive element being connected to a first gate terminal of the first P-type MOS transistor and a second terminal of the first at least one resistive element being connected to a second gate terminal of the second P-type MOS transistor;

a first inverter having a first input terminal and a first output terminal, the first input terminal being connected to a first input signal line and the first output terminal being connected to the first gate terminal of the first P-type MOS transistor;

at least one charging P-type MOS transistor, the at least one charging transistor being a third P-type MOS transistor having a drain terminal connected to the second gate terminal of the second P-type MOS transistor, a source terminal of the third P-type MOS transistor being connected to the power supply and a gate terminal of the third P-type MOS transistor being connected to the first input signal line;

at least two output N-type MOS transistors, a source terminal of a first N-type MOS transistor of the at least two output N-type MOS transistors and a source terminal of a second N-type MOS transistor of the at least two output N-type MOS transistors being connected to a ground and drain terminals of the first and second N-type MOS transistors being connected to the output pad;

a second at least one resistive element, a first terminal of the second at least one resistive element being connected to a first gate terminal of the first N-type MOS transistor and a second terminal of the second at least one resistive element being connected to a second gate terminal of the second N-type MOS transistor;

a second inverter having a second input terminal and a second output terminal, the second input terminal being connected to a second input signal line and the second output terminal being connected to the first gate terminal of the first N-type MOS transistor; and at least one charging N-type MOS transistor, the at least one charging transistor being a third N-type MOS transistor having a drain terminal connected to the second gate terminal of the second N-type MOS transistor, a source terminal of the third N-type MOS transistor being connected to the ground and a gate terminal of the third N-type MOS transistor being connected to the second input signal line.

11. The 3-state output buffer circuit according to claim 10, wherein the first at least one resistive element is an N-type MOS transistor, a gate terminal of the N-type MOS transistor being connected to the power supply, the second at least one resistive element being a P-type MOS transistor, a gate terminal of the P-type MOS transistor being connected to the ground.

12. The 3-state output buffer circuit according to claim 10, wherein the first and second at least one resistive elements are diffusion resistors and poly-silicon resistors, each of the first and second at least one resistive elements being doped with an impurity.

13. An output buffer circuit, comprising:

at least two output N-type MOS transistors, a source terminal of a first N-type MOS transistor of the at least two output N-type MOS transistors and a source terminal of a second N-type MOS transistor of the at least two N-type output MOS transistors being connected to a ground and drain terminals of the first and second N-type MOS transistors being connected to an output pad;

at least one passive resistive element, a first terminal of one of the at least one passive resistive element being connected to a first gate terminal of the first N-type MOS transistor and a second terminal of the one of the at least one passive resistive element being connected to a second gate terminal of the second N-type MOS transistor;

an inverter having an input terminal and an output terminal, the input terminal being connected to an input signal line and the output terminal being connected to the first gate terminal of the first N-type MOS transistor; and at least one charging N-type MOS transistor, the at least one charging transistor being a third N-type MOS transistor having a drain terminal connected to the second gate terminal of the second N-type MOS transistor, a source terminal of the third N-type MOS transistor being connected to the ground, a gate terminal of the third N-type MOS transistor being connected to the input signal line.

14. The output buffer circuit according to claim 13, wherein the at least one passive resistive element is one of a diffusion resistor and a poly-silicon resistor, each of the at least one passive resistive element being doped with an impurity.

15. The output buffer circuit according to claim 13, wherein the at least one resistive element is a P-type MOS transistor, a gate terminal of the P-type MOS transistor is connected to the ground.

* * * * *